(12) United States Patent
Lim (10) Patent No.: US 7,553,745 B2
(45) Date of Patent: Jun. 30, 2009

(54) INTEGRATED CIRCUIT PACKAGE, PANEL AND METHODS OF MANUFACTURING THE SAME

(75) Inventor: Chee Chian Lim, Alor Gajah Melaka (MY)

(73) Assignee: Infineon Technologies AG, Neubiberg (DE)

(*) Notice: Subject to any disclaimer, the term of this patent is extended or adjusted under 35 U.S.C. 154(b) by 82 days.

(21) Appl. No.: 11/829,419

(22) Filed: Jul. 27, 2007

(65) Prior Publication Data
US 2008/0009097 A1 Jan. 10, 2008

Related U.S. Application Data

(63) Continuation of application No. PCT/IB2005/000198, filed on Jan. 27, 2005.

(51) Int. Cl.
*H01L 21/00* (2006.01)
(52) U.S. Cl. .................. 438/464; 257/E23.179; 438/113; 438/460
(58) Field of Classification Search ............. 438/113, 438/460, 464; 257/E23.179
See application file for complete search history.

(56) References Cited

U.S. PATENT DOCUMENTS

| 6,228,687 | B1 | 5/2001 | Akram et al. |
|---|---|---|---|
| 6,960,490 | B2* | 11/2005 | Cunningham ............... 438/107 |
| 2002/0167078 | A1 | 11/2002 | Winderl et al. |
| 2003/0015774 | A1 | 1/2003 | Auburger et al. |
| 2003/0057529 | A1 | 3/2003 | Ikenaga |
| 2003/0062613 | A1 | 4/2003 | Masumoto et al. |
| 2004/0089922 | A1 | 5/2004 | Gerber et al. |
| 2005/0272225 | A1* | 12/2005 | Weber et al. ................ 438/460 |

FOREIGN PATENT DOCUMENTS

WO 02/01634 A2 1/2002

* cited by examiner

Primary Examiner—David A Zarneke
Assistant Examiner—Jenny L Wagner
(74) Attorney, Agent, or Firm—Edell, Shapiro & Finnan, LLC (57) ABSTRACT

A method of manufacturing an integrated circuit package includes: assembling a composite wafer including alternating rows or columns of first and second strips on an adhesive tape, the first strips including a plurality of first dies and the second strips including a plurality of second dies, singulating the first dies from the first strips and the second dies from the second strips, forming a bond wire between respective ones of the first dies and respective ones of the second dies, thereby forming a plurality of component, embedding the components in mold compound, thereby forming a panel and separating the components from the panel, thereby forming individual integrated circuit packages.

9 Claims, 4 Drawing Sheets

INTEGRATED CIRCUIT PACKAGE, PANEL AND METHODS OF MANUFACTURING THE SAME

CROSS REFERENCE TO RELATED APPLICATIONS

This application is a continuation of International Application No. PCT/IB2005/000198, filed on Jan. 27, 2005, entitled "Semiconductor Package, a Panel and Methods of Assembling the Same," the entire contents of which are hereby incorporated by reference.

BACKGROUND

The reduction of the size and reduction of the cost of semiconductor packages is a long-standing desire in the development of semiconductor packages. It is desired to decrease both the footprint of the package, (i.e., the lateral dimensions of the package) so that the space required to mount the package on the board is reduced, and the thickness of the package.

The cost of the semiconductor package can be reduced by reducing the materials costs by, for example, reducing the size of the package or through the choice of the materials. However, a greater cost saving can usually be achieved by simplifying and streamlining the production and assembly processes.

One known approach to solving these problems is to provide a leadless semiconductor package. In this method, a package substrate is prepared by depositing raised metal bumps or regions onto a base or carrier substrate. The raised regions from the substrate which is included in the semiconductor package. The carrier or base substrate is typically a metal foil and is removed after the assembly of the components.

A plurality of package positions can be provided on the base substrate. The arrangement of the raised regions of each package position corresponds to the desired arrangement of the substrate of the package. In leadless packages the raised regions also provide the external contact areas of the package. A chip or contact is mounted onto each bump or raised region using a pick-and-place method. After the bonding and encapsulation processes, the base substrate is removed.

This method has disadvantages as it is costly and time consuming. First, a base substrate including the required raised regions or bumps is prepared and then, the semiconductor chip and contacts are placed one-by-one or serially onto the raised regions. The speed with which this process can be carried out and the packing density of the package positions on the base substrate is limited. This increases the costs of the process and, therefore, the cost of the packages.

SUMMARY

Integrated circuit packages (e.g., semiconductor packages), intermediate products, such as a panel, and methods of producing the panel and the semiconductor packages are described herein. The method of manufacturing an integrated circuit package includes: assembling a composite wafer including alternating rows or columns of first and second strips on an adhesive tape, the first strips including a plurality of first dies and the second strips including a plurality of second dies, singulating the first dies from the first strips and the second dies from the second strips, forming a bond wire between respective ones of the first dies and respective ones of the second dies, thereby forming a plurality of component, embedding the components in mold compound, thereby forming a panel and separating the components from the panel, thereby forming individual integrated circuit packages.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Embodiments of the described integrated circuit package and method will now be described with reference to the diagrams, where.

DETAILED DESCRIPTION

The described method for manufacturing a semiconductor package allows for simple and easy assembly of a panel and for fabrication of an improved package. The described semiconductor package comprises a first semiconductor die which has an upper surface and, on its opposing side, a lower surface. The semiconductor package also comprises a second semiconductor die, with an upper surface and, on its opposing side, a lower surface. The first semiconductor die is electrically connected to the second semiconductor die via a bond wire. The upper surface of the dies is defined as the surface onto which the bond wire is located. This surface faces upwardly when the package is mounted on an external substrate. The lower surfaces of the dies do not include bond wires and face downwardly when the package is mounted on an external substrate. The first die and second die form a component which is included in the package.

The first semiconductor die and the second semiconductor die are separated by predetermined distance. This distance arises from the assembly method of the package. The first and second semiconductor die are more closely spaced than in packages known in the prior art. Thus, a package with a small footprint is provided.

The package further includes mold material which encapsulates the upper and side surfaces of the dies and the bond wire. The lower surfaces of the first and second die are essentially coplanar with the bottom surface of the mold material and form the outer bottom surface of the package. The lower surfaces of the dies provide the external contacts to the package. This provides a leadless package. The lower surfaces of the dies are, therefore, free from the mold material or compound and provide the external contacts to the package. The package is, therefore, mounted to the external circuit board by these areas.

Optionally, the first die is a receiver die and the second die is an emitter or a conductive die.

The lower surface of the first die and the lower surface of the second die advantageously include a metallization layer. Optionally, the metallization layers located on the lower or rear surface of the dies and the bottom surface of the mold compound are essentially coplanar. The metallization layer enables the dies to be mounted to an external substrate such as a printed circuit board via a solder process. This provides a simple method of achieving a good bond via known and reliable techniques. Since the package avoids the need of a substrate which is included within the package, the thickness of the package is reduced.

The described package is very flexible as the two dies may have different dimensions. For example, it is advantageous that the breadth and thickness of the first die is different to the breadth and thickness of the second die. The first die may, therefore, be fabricated on a first wafer and the second die on a second wafer. The first and second die can, therefore, comprise a different semiconductor material. The described package is also very flexible in that the two types of die can be fabricated separately in two separately optimized processes and then assembled to form the semiconductor package.

However, the length of the first die is, optionally, essentially the same as the length of the second die. This simplifies the singulation of the components, each including one first die and one second die, which are included in the package as is described in more detail with respect to the method by which the package is assembled.

The first die and the second die, advantageously, have at least one side face with a stepped contour. This is advantageous as a form-locking engagement between the dies and the mold material is provided. Optionally, at least two opposing sides have a stepped contour as this singulation process is simplified if all the dies are singulated in one lateral direction by the same saw blade, if a profile saw is used to produce the step, or in the same method step, if two saw blades of different width are used to produce the step. A form-locking engagement reduces the likelihood of delamination of the mold material from the die and, therefore, provides a more reliable semiconductor package.

Advantageously, the first die and the second die have a protruding upper portion. This advantageously increases the lateral area of the active region of the upper surface of the dies. Alternatively, the first die and the second die have a protruding base portion. This advantageously provides a larger external contact area for the package. This leads to a lower contact resistance when the package is mounted on an external substrate.

The package, optionally, has dimensions of approximately 0.5 mm in length, approximately 0.3 mm in width and approximately 0.2 mm in height. Moreover, the package optionally has a height of around 0.1 mm. The package is, therefore, smaller than typical packages of the prior art.

The following describes an intermediate product or panel provided for the fabrication of the semiconductor packages according to one of the embodiments previously described. The panel includes a plurality of components; one component is included in each semiconductor package. Each component has a first die with an upper surface and a lower surface and a second die with an upper surface and a lower surface. The first die and the second die of each component are separated by a pre-determined distance and are connected to each other via a bond wire.

The panel further includes mold material in which the plurality of components is embedded. The upper surface and side faces of each die and the bond wire of each component are embedded in a single mass of mold material. The lower surface of the first die and the lower surface of the second die are essentially coplanar with the bottom surface of the mold material. The lower surfaces of the dies and the bottom surface of the mold material provide the bottom surface of the panel.

Advantageously, the components included in the panel have an arrangement and spacing which is essentially the same as that of a composite wafer. Therefore, the packing density of the components within the panel is much higher than in conventional panels. The packages, therefore, have a smaller footprint. Since the rear surface of the dies is coplanar with the bottom surface of the mold material and, therefore, the outer surface of the panel, a thinner package is provided.

Optionally, the plurality of first dies and the plurality of second dies have at least one side face with a stepped contour. This provides a form-locking engagement between the dies and the mold material. This increases the interfacial stability of the dies within the mold mass and reduces the likelihood that cracks will from at the interface either due to thermal cycling or, more advantageously, during the singulation of the packages from the panel. The number of defective packages produced from a panel is, therefore, reduced. This reduces the costs of the correctly functioning packages.

The first dies and the second dies advantageously have a protruding base portion. This advantageously enables the dies to be easily singulated by sawing from the upper surface. Alternatively, the first dies and the second dies have a protruding upper portion. The active area of the upper surface of the dies is, in this alternative, increased.

The panel is provided to fabricate the semiconductor packages according to one of the embodiments already described. Therefore, the width and thickness of the first dies of the panel is different to the width and thickness of the second dies of the panel. The length of the first dies is essentially the same as the length of the second dies.

Advantageously, the lower surface of the first dies and the lower surface of the second dies include a metallization layer. The metallization layer enables these areas, which provide the external contact areas of the package, to be soldered to an external substrate. A low resistance contact is, therefore, provided.

Optionally, the metallization layer and the bottom surface of the mold compound are essentially coplanar. The metallization layer, therefore, remains free of the mold material and forms the external contact areas of the component. The components, each including a first die and a second die can be singulated from the panel and can be mounted to an external substrate without further preparation of the external contact areas.

In an exemplary embodiment of the panel, the first dies are receiver dies and the second dies are emitter or conductive dies. Each of the plurality of receiver dies and each of the plurality of emitter or conductive dies is essentially the same.

The first dies and the second dies are arranged in the panel in a regular grid array. The panel includes one row of first dies arranged in the row with a pre-determined interval. A row of second dies arranged with the same pre-determined interval is arranged adjacent to the first dies. The first and second dies are laterally arranged so that the upper surfaces of the areas of the dies are in lateral alignment. A panel is, therefore, formed in which a plurality of components, each component including one first die and one second die, have a regular grid array. Therefore, the singulation of the packages from the panel is simplified.

The following describes methods of fabricating the semiconductor package and panel according to one of the embodiments previously described. The method, according to an exemplary method, to fabricate a semiconductor package comprises the following steps. First, a first semiconductor wafer including a plurality of first semiconductor dies is provided. A second semiconductor wafer including a plurality of second semiconductor dies is also provided. As previously described, the first and second semiconductor wafers, preferably, include different types of devices and may be of a different thickness.

The first semiconductor wafer is then cut into first strips. This is easily and simply performed via known sawing techniques. Each first strip includes a plurality of first dies. Optionally, each strip includes a single row of dies.

The second semiconductor wafer is also singulated to produce second strips. Each second strip also includes a plurality of second dies, which, optionally, are arranged in a single row in the strip.

A composite wafer is then assembled by arranging alternating rows or columns of first and second strips on an adhesive tape so that a plurality of alternating first and second strips are attached to the adhesive tape. The first strips are separated from the second strips by a predetermined distance.

The first dies are then singulated from the first strips and the second dies are then singulated from the second strips. A matrix of separate first and second dies is, thereby, formed. The first and second dies are still attached to the adhesive tape after the singulation process and thus form a composite wafer.

A bond wire is formed between a first die and a second die to form a component. Optionally, the bond wire is formed between a first die and a second die which are located adjacent to each other in the composite wafer (i.e., in adjacent rows of the composite wafer). This simplifies the layout of the matrix of components and provides a small component.

A bond wire is, optionally, formed between each pair of dies which form a component within the composite wafer. Therefore, a plurality of components is formed while the components are attached to the adhesive tape and have the form of a composite wafer. Since the components have a high packing density, the bonding process can be easily and quickly carried out using automated equipment. This simplifies the manufacturing process and reduces the costs of producing the package.

The plurality of components is embedded or encapsulated in a single mass of a mold compound thereby forming a panel. Since the lower surfaces of the dies are attached to the adhesive tape, the lower surfaces remain free of the mold material. Therefore, the external contact areas of the package remains remain free of the mold material.

The components are then singulated from the panel to form individual packages. Since the components are arranged in regular grid array, a sawing process can be used. The packages are still attached to the adhesive tape and are still in the form of a composite wafer.

Optionally, the first dies are arranged in the first strip and the second dies are arranged in the second strip with a first interval. The interval being the distance between the same points on the active portion of the device included on the die. This enables the active areas of the two types of die to be laterally aligned with respect to each other. This simplifies the alignment of the two strips with each other and simplifies the bonding and simplifies singulation processes. This further reduces the manufacturing costs.

The first dies are, optionally, separated from adjacent first dies in the first strip by a first singulation trench. The singulation trench includes no active parts of the device and provides an area where the dies can be singulated without damaging the devices. The first singulation trench has a first width and a first lateral center.

The second dies are also, optionally, separated from adjacent second dies in the second strip by a second singulation trench. The second singulation trench has a second width and a second lateral center.

The width of the first singulation trenches is, therefore, not necessarily the same as the width of the second singulation trenches. If the active area of the first dies are laterally larger than the active area of the second dies then, in order that the interval between the first dies is essentially the same as the interval between the second dies, the singulation trenches between adjacent first dies is reduced accordingly. The respective widths of the singulation trenches of the first and second strip are chosen to take into account the different lateral sizes of the two types of dies and the minimum distance necessary for a singulation trench.

The first strips and second strips are arranged to form the composite wafer so that the center lines of the first and second singulation trenches are in lateral alignment across the breadth and length of the composite wafer. This forms a singulation line which is common to both the first and second strips. This advantageously enables the first dies to be singulated from the first strips and the second dies to be singulated from the second strips via cutting along the common singulation line. This provides a simple and quick method via which the two types of dies can be singulated from the strips in the same process step.

Advantageously, the first dies and the second dies are singulated to form at least one side face with a stepped contour. This is easily carried out via either a profile saw or in two cutting steps via two saw blades of different widths. The step provides a form-locking engagement between the dies and the mold compound which leads to a more reliable package.

Optionally, the first dies and the second dies are singulated to form two opposing side faces with a stepped contour. This simplifies the singulation process since all of the cuts in one lateral direction can be made in the same process step.

A metallization layer is advantageously deposited on the rear surface of the first wafer and on the rear surface of the second wafer. Therefore, the rear surface of the plurality of first dies and the plurality of second dies are coated with the metallization layer at essentially the same time which reduces the processing time and costs. Since these surface are in contact and covered by the adhesive tape during the subsequent assembly steps, the surfaces remain free of contamination by mold material and cutting fluids.

After the individual packages are separated from the panel but while they are still attached to the adhesive tape and are still in the form of a composite wafer, the following additional steps are, advantageously, carried out. First, the wafer can be mapped and the packages marked via laser. This is particularly easily and accurately carried out as the packages are still held in the form of the composite wafer.

Next, the upper surface of the packages is laminated to package lamination tape and the adhesive tape is removed. This reveals the bottom surface of the dies and, if included, the metallization layer. The packages can then be tested while still in the form of the composite wafer. This enables a rapid testing of the packages and the easy identification of defective packages. The package lamination tape is then removed and the packages packed into carrier or shipping tape for transportation to their point of use.

The described method and the packages produced by the described method have many advantages over the prior art methods and packages. The components are packaged at essentially the wafer level. This produces packages which have a smaller footprint than methods using a base substrate onto which the dies are placed using pick-and-place methods. Since pick-and-place methods are not used, the dies may be thinner than those used in conventional packages since they do not have to withstand mechanical handling during a die placement and mounting process. The possibility of cracking in the die during the assembly process is, therefore, avoided. Dies can, therefore, be as thin as 25 µm (micron) in the package of the invention and the thickness or height of the package further reduced.

Also, since a substrate within the package is avoided, the thickness of the package is further reduced. The electrical performance of the package is also improved and power consumption reduced since there is no power loss due to the relatively high resistance of a substrate. Since the electrical performance is improved, this enables the use of bonding wires of a smaller diameter, for example 18 µm (micron), which further reduces the materials costs of the package. Materials costs are also reduced by the described method as a single-use carrier substrate which is then removed, often by an etching process, is avoided.

Since the bonding and encapsulation processes are carried out while the die and components are held to form a composite wafer, the packing density of the components in the panel is much higher than in conventional processes. The molding and testing process is, in particular, accelerated. Since the packages are attached to the adhesive tape as a composite wafer, wafer mapping and wafer level testing of the packages is enabled.

Through manufacturing semiconductor packages via the described method, semiconductor packages which are two times smaller than conventional TSLP packages can be provided. Packages can be provided with a footprint of 0.3 mm by 0.5 mm and with a thickness of only 0.2 mm and even 0.1 mm.

In the following paragraphs, exemplary embodiments of the integrated circuit package, the panel and method are described in connection with the figures.

Figure 1:
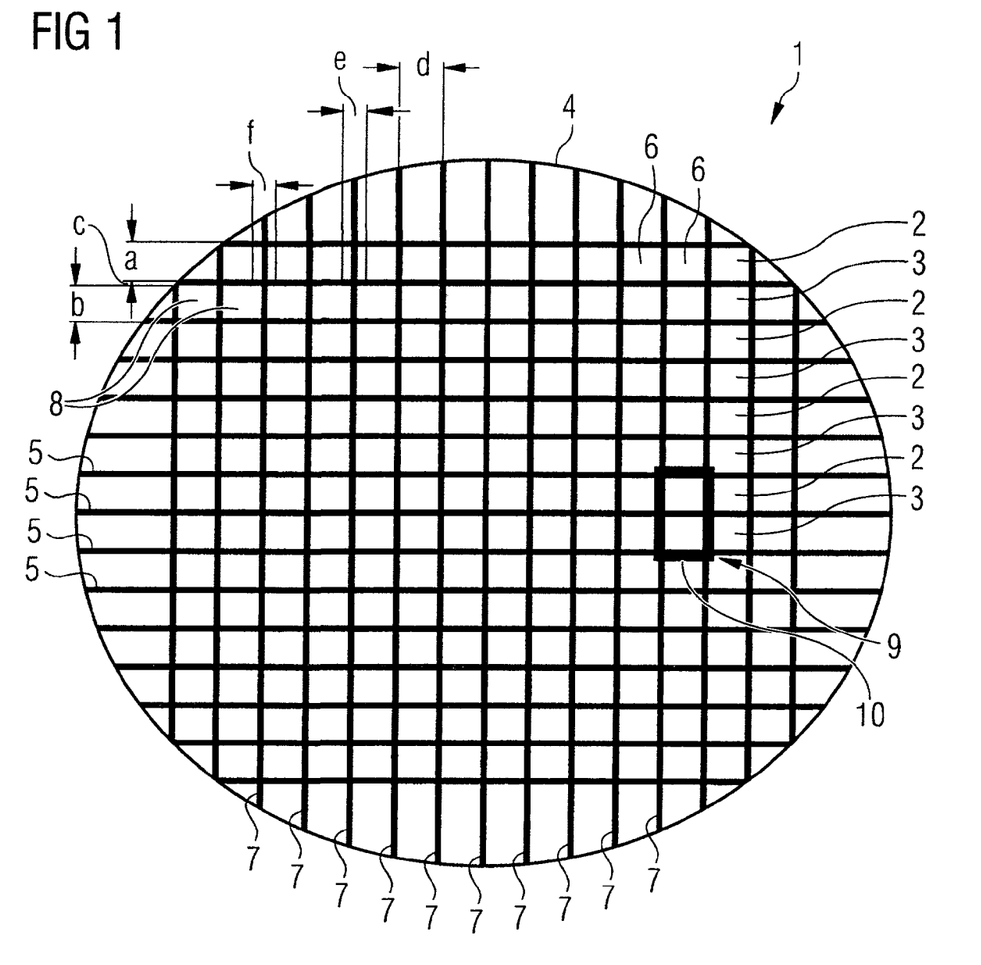
FIG. 1 shows a top view of a composite wafer including alternating rows of receiver die and emitter die.

FIG. 1 shows the first step according to an exemplary embodiment of the method to fabricate a leadless semiconductor package at the wafer level. Initially, a first precursor semiconductor wafer is fabricated which includes a plurality of receiver dies 6. A second precursor semiconductor wafer is fabricated which includes a plurality of emitter or conductive dies 8. The first and the second wafers are then cut into respective strips 2, 3. Each strip 2, 3 includes a plurality of the respective dies arranged in a single row or column.

FIG. 1 illustrates the first stage in the method according to the invention. First, a composite wafer 1 is assembled from strips 2 of the first semiconductor wafer, each strip 2 including a plurality of receiver dies 6 arranged in a single row, and from strips 3 of the second semiconductor wafer, each strip 3 including a plurality of emitter or conductive die 8 arranged in a single row.

The composite wafer 1 is assembled on an adhesive tape 4, by arranging alternately strips 2 of the first wafer including receiver dies 6 and strips 3 of the second wafer including emitter dies 8. The adhesive tape 4 cannot be seen in the top view of FIG. 1. In the orientation of the composite wafer 1 shown in FIG. 1, the strips 2, 3 are arranged in horizontally in rows with the upper surface facing upwards. The adhesive tape 4 holds the strips 2, 3 and the dies 6, 8 in the form of the composite wafer 1 during the subsequent processing steps.

The strip 2 of receiver dies 6 has a width a which, in this embodiment of the invention, is smaller than the width b of the strip 3 of emitter dies 8. Therefore, the outer edge of the composite wafer 1, which is made up of alternating strips 2 of receiver dies 6 and strips 3 of emitter dies 8, has an elliptical form. For the orientation of the composite wafer 1 shown in FIG. 1, the composite wafer 1 is slightly larger in the horizontal direction in comparison with the vertical direction.

Adjacent strips 2 of receiver dies 6 and strips 3 of the emitter dies 8 are separated from each other by a distance c which is indicated in FIG. 1 by the plurality of thick horizontal lines 5.

Each strip 2 of receiver dies 6 includes a plurality of individual receiver dies 6 arranged at regular intervals along the length of the strip 2. Each individual receiver die 6 is separated from its adjacent neighbors in the strip 2 by a singulation trench or saw street 33. The central line of the singulation trench 33 is indicated by the line 7. Each receiver die 6 has a length which is defined as the distance between the central lines of adjacent singulation trenches 7. This length is denoted in FIG. 1 as d.

Similarly, each strip 3 of emitter or conductive dies 8 includes a plurality of emitter or conductive dies 8 arranged at regular intervals along its length. Each emitter die 8 is separated from adjacent dies 8 by a singulation trench 34. The central line of the singulation trench 34 is denoted by the line 7. As can be seen in FIG. 1, the length of each emitter die 8, defined as the distance between the central lines of adjacent singulation trenches 34 in the strip 3, is essentially the same as the length of the receiver die 6 in the strip 2. Therefore, the length of each emitter die 8 is also denoted by d.

The two types of strips, the strips 2 of receiver dies 6 and the strips 3 of emitter dies 8, are arranged to form the composite wafer 1 so that the center lines 7 of the singulation trenches of each of the two types of strip 2, 3 are in lateral alignment. This is indicated by the continuous lines of the singulation trenches 7 across the entire composite wafer 1 in FIG. 1.

In order that the center lines 7 of the singulation trenches 33, 34 of the respective two types 2, 3 of strip align in the composite wafer 1, the pitch or interval between the same point in adjacent devices 6, 8 in each of the strips 2, 3 is essentially the same. As the lateral size of the active area of the receiver die 6 is not necessarily the same as the active area of the emitter die 8, the length of the singulation trenches 33, 34 of the respective two strips 2, 3 is not necessarily the same. The strip 2 of receiver dies 6 includes singulation trenches 33 of a length e and the strip 3 of emitter dies 8 includes singulation trenches 34 of a length f.

In the next step of the exemplary method, the receiver dies 6 and emitter dies 8 are separated or singulated from the composite wafer 1 via sawing along the common central lines of the singulation trenches 7. The receiver dies 6 and emitter dies 8 are singulated in the same cut.

Each electronic component 9, which is to be included in the final semiconductor package, includes a receiver die 6 and an emitter die 8. Each component 9 includes a receiver die 6 and an emitter die 8 which are positioned next to each other in the composite wafer 1. Therefore, the composite wafer 1, as illustrated in FIG. 1, includes a plurality of components 9 arranged in rows and columns in a regular array. One component 9 is indicated in FIG. 1 by a rectangular box 10.

Figure 2:
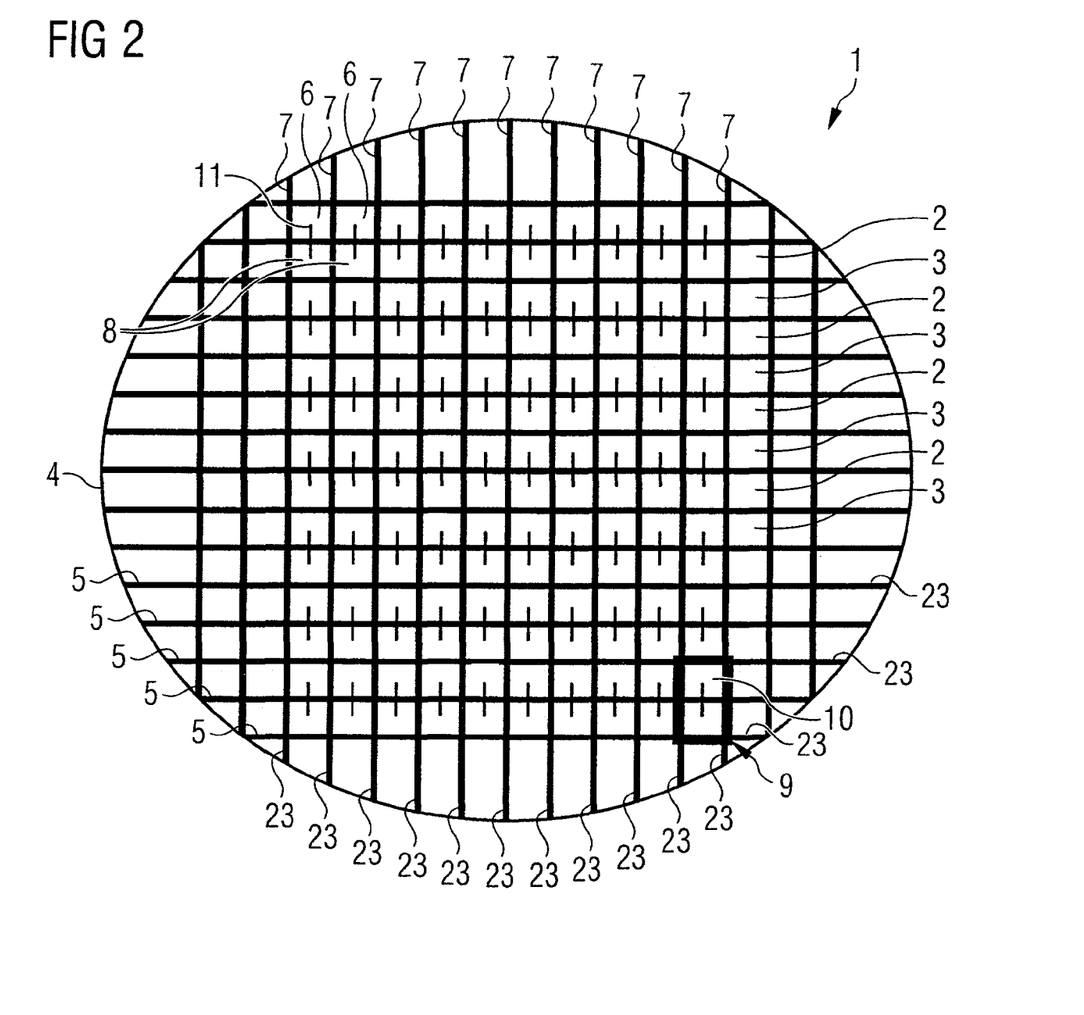
FIG. 2 illustrates the wire bonding process of the components of the composite wafer of FIG. 1.

FIG. 2 illustrates the next step in the method according to the invention. While the plurality of receiver die 6 and the plurality of emitter die 8 are attached to the adhesive tape 4 in the form of the composite wafer 1, the wire bonding process is carried out. A wire bond 11 is formed between each receiver die 6 and emitter die 8 which are to form a component 9.

The square grid arrangement of the plurality of components 9 including their respective bond wires 11 is shown in the top view of FIG. 2. Since the wire bonding process is carried out at the wafer level, the exemplary method is simple and quick to perform for a large number of components 9.

Figure 3:
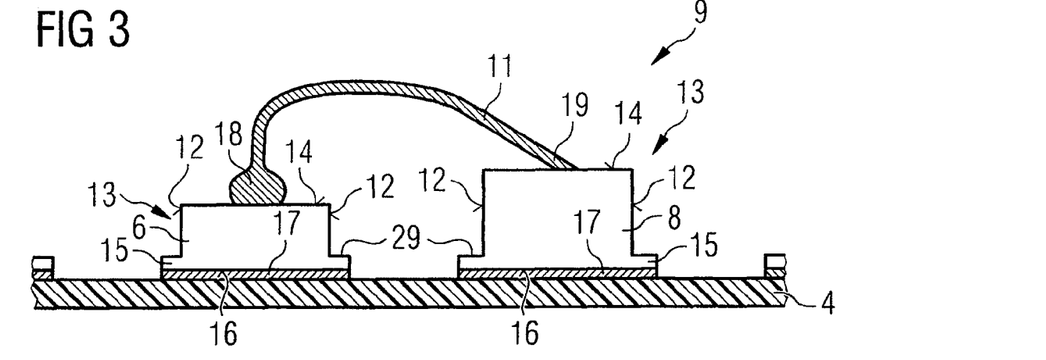
FIG. 3 illustrates a cross-sectional view of a section of the composite wafer of FIG. 2.

FIG. 3 shows a cross-sectional view of a section of the composite wafer 1 of FIG. 2, one component 9 is depicted. In this first embodiment, the receiver dies 6 and the emitter dies 8 are singulated from their respective wafers to form side faces 12 of the receiver dies 6 and emitter dies 8 which have a non-straight contour (i.e., the side faces 12 being contoured). The receiver dies 6 and emitter dies 8 are singulated to produce side faces 12 to both the receiver die 6 and the emitter die 8 which include a step 29. This is carried out either using a two-step sawing process using two saw blades of different widths or in a single sawing cut by using a profile saw.

In this first embodiment of the component 9, both the receiver dies 6 and emitter dies 8 include a cutout 13 in the edge formed between the upper surface 14 and the side faces 12 of the dies 6, 8. Each die 6, 8, therefore, has a base portion 15 which protrudes outwards providing a step 29 in the side faces. The base portion 15 is laterally larger than the upper surface 14 of the die. The step 29 formed in the side faces 12 improves the locking of the mold compound of the semiconductor package with the semiconductor dies as a form-locking engagement is provided.

The cross-sectional view of FIG. 3 also shows that the lower surface 16 of each receiver die 6 and emitter die 8 includes a metal layer 17. The metallization layer 17 is deposited on the rear surface of the dies during the fabrication process of the initial precursor wafers. The metallization layer 17 is deposited on the rear surface of the first precursor wafer including the receiver die 6 and on the rear surface of the second precursor wafer including the emitter die 8 before the strips 2, 3 are singulated from their respective wafer.

The metallization layer 17 includes, in this embodiment of the invention, two layers; a layer of nickel and a layer of gold. Alternatively, the metallization layer 17 may include a layer of nickel and a layer of silver. The metallization layer 17 enables the package 22 to be soldered onto an external substrate such as a printed circuit board.

The cross-sectional view of the component 9 of FIG. 3 also shows that the thickness of the receiver die 6 and thickness of the emitter die 8 is not identical. In this embodiment, the receiver die 6 is thinner than the emitter die 8. This is easily accomplished as each type of die 6, 8 is initially fabricated on a separate precursor wafer.

As is also more easily seen in the cross-sectional view of FIG. 3, the wire bond 11 between the receiver die 6 and the emitter die 8 is formed by a ball-bonding technique. The ball bond, characterized by the ovoid head 18, is first bonded to the upper surface 14 of the receiver die 6. The wire 11 is then extended to the upper surface 14 of the emitter die 8 where it is attached by a wedge bond 19. A wire bond 11 is formed between each of the pairs of receiver die 6 and emitter die 8 which make up a component 9 of the composite wafer 1 in the same process step. The wire-bonding process is easily carried out since the plurality of receiver dies 6 and the plurality of emitter dies 8 are attached to the adhesive tape 4 and have the from of a composite wafer 1.

Figure 4:
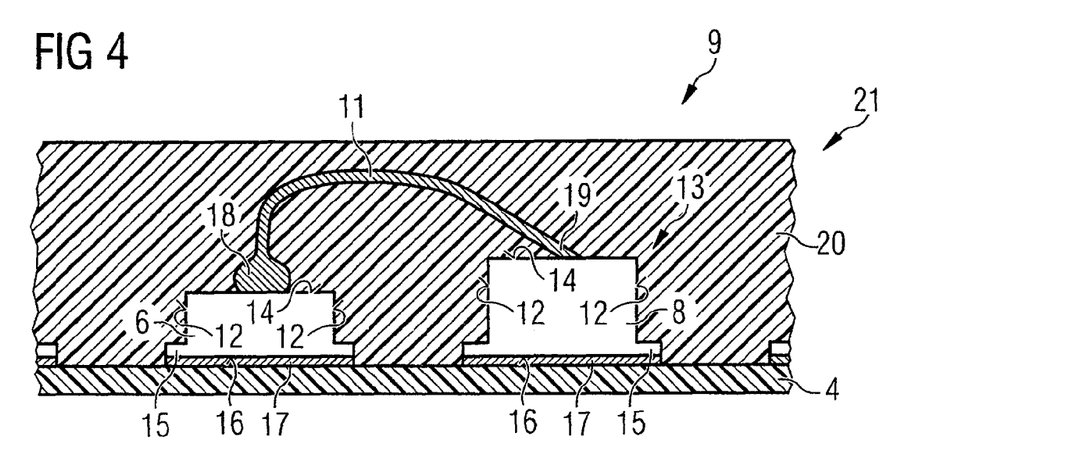
FIG. 4 illustrates a cross-sectional view of a section of the composite wafer of FIG. 3 after the molding process.

FIG. 4 illustrates the next stage in the exemplary method and shows a cross-sectional view of a section of the composite wafer of FIG. 3 after the molding process. According to the exemplary method, in the next step of the method the plurality of components 9 are encapsulated in a single molding compound 20 while still attached to the adhesive tape 4 and still in the form of the composite wafer 1. Therefore, a single panel 21 is fabricated in which all of the components 9 are embedded. The metallization layer 17 of the receiver dies 6 and emitter dies 8 remains free of the mold material 20.

In the next stage of the method, the individual packages 22 are singulated from the panel 21. This is carried out by sawing the panel 21 in approximately the lateral center of the package singulation trenches 23 which separate adjacent components 9 in the panel 21. The central line of the singulation trenches 23 is indicated by the lines 23 in FIG. 5 and in the top view of FIG. 2. As can be more easily seen in FIG. 2, the singulation lines 7 and 23 coincide in the vertical direction. In the horizontal direction, the singulation lines 23 are positioned in every second die separation line 5 as each component 9 includes one receiver die 6 and one emitter die 8. The plurality of packages 22 are still attached to the adhesive tape 4 after the package singulation step.

Figure 5:
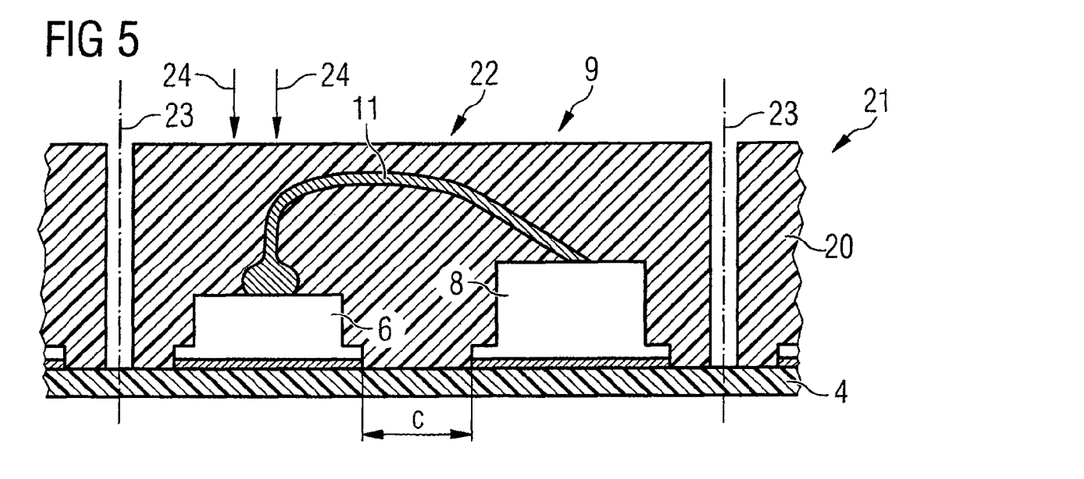
FIG. 5 shows a cross-sectional view of a section of the composite wafer of FIG. 4 after the package singulation process.

The packages 22 then undergo laser marking, as indicated by the arrows 24 while still held on the adhesive tape 4 in the from of the composite wafer 1. Wafer mapping may also be carried out at this stage of the method.

Figure 6:
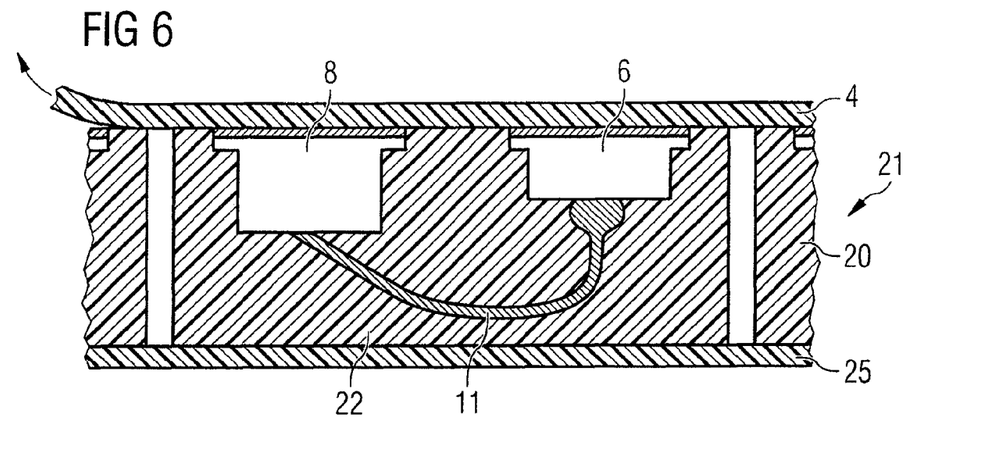
FIG. 6 illustrates the lamination of the packages of FIG. 5.

FIG. 6 shows the next step of the process in which the upper surfaces of the plurality of packages 22 are laminated to a package tape 25. The adhesive tape 4 which is attached to the lower surface of the dies and, therefore, the bottom surface of the package 22, is then removed as indicated by the arrow. The metallization layer 17 located on the bottom lower surface of the receiver die 6 and emitter die 8 is therefore exposed from the package 22 and is coplanar with the bottom surface of the package 22.

Figure 7:
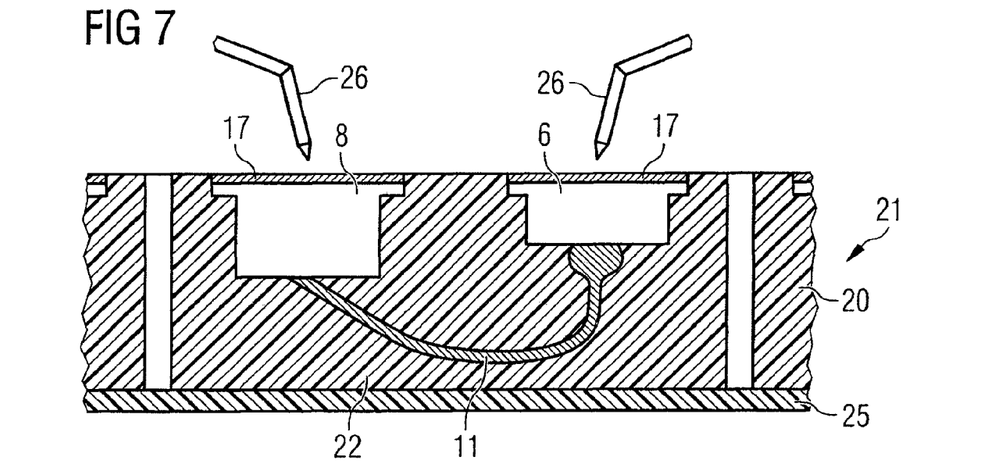
FIG. 7 shows the testing of the packages of FIG. 6.

FIG. 7 shows that, after the package lamination process, the plurality of packages 22 are still held on the package lamination tape 25 in essentially a wafer-level configuration. Therefore, the individual packages 22 can undergo wafer level testing as indicated by the probes 26.

The package lamination tape 25 is then removed from the plurality of packages 22. This can be easily performed by irradiating the tape 25 with UV radiation which enables the tape 25 to be cleanly removed from the mold compound 20 of the package 22.

The packages 22 are then packed into a carrier or transport tape and shipped to the customer or point of use. The packages 22 then can be mounted onto an external substrate such as a printed circuit board.

Figure 8:
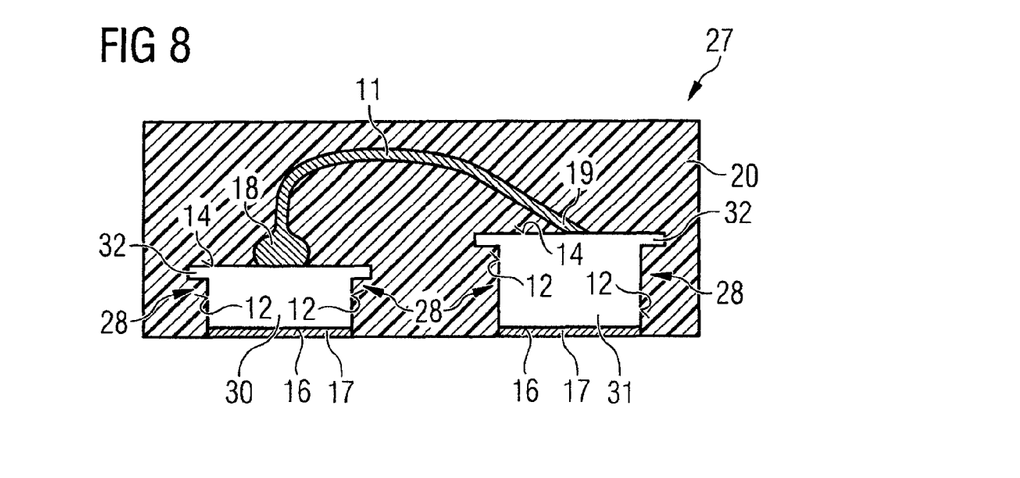
FIG. 8 illustrates a second embodiment of the package.

FIG. 8 shows a second embodiment of a package 27 fabricated via the exemplary method. Parts of the package 27, according to the second embodiment, which are essentially the same as those of the package 22 of the first embodiment are denoted by the same reference number and are not necessarily described again.

The second package 27 differs from the first package 22 in that the side faces 12 of the receiver die 30 and the side faces of the emitter die 31 include a cutout 28 in the edge formed between the lower surface 16 and the side faces 12. Therefore, the upper surface 14 of the dies 30, 31 is larger than that of the lower surface 16. The side faces 12 have a stepped contour and the receiver die 30 and emitter die 31 have an upper portion 32 which protrudes laterally outwards.

The packages 22, 27 produced via the exemplary method are fabricated at the wafer-level. The use of a substrate in the package or for the assembly of the package is avoided. The size of the package 22, 27 produced via the exemplary method is, therefore, reduced as compared to the size of known packages. The lateral size of the packages 22, 27 is typically 0.5 mm by 0.3 mm, which is around two times smaller than known packages including a substrate. Since the described packages 22, 27 are leadless and substrate-less, the height of the packages 22, 27 can be reduced to about 0.2 mm or even to 0.1 mm which is up to four times smaller than the known packages.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of manufacturing an integrated circuit package, the method comprising:
    providing a first integrated circuit wafer including a plurality of first integrated circuit dies;
    providing a second integrated circuit wafer including a plurality of second integrated circuit dies;
    singulating the first wafer into first strips, each first strip including a plurality of first dies;
    singulating the second wafer into second strips, each second strip including a plurality of second dies;
    assembling a composite wafer by interleaving first and second strips on an adhesive tape;
    singulating the first dies from the first strips and singulating the second dies from the second strips;
    forming bond wires between respective ones of the first dies and respective ones of the second dies to form a plurality of components;
    encapsulating the plurality of components in a mold compound, thereby forming a panel; and
    singulating the components from the panel thereby forming at least one integrated circuit package.

2. The method according to claim 1, wherein the first dies are arranged in the first strip and the second dies are arranged in the second strip with a first interval.

3. The method according to claim 1, wherein:
    the first dies of the first strips are separated from adjacent first dies in respective first strips via a first singulation trench having a first width and a first lateral center; and
    the second dies of the second strips are separated from adjacent second dies in respective second strips via a second singulation trench, the second singulation trench having a second width and a second lateral center.

4. The method according to claim 3, wherein the first strips and the second strips are arranged in the composite wafer so that the first lateral center of the first singulation trench is laterally aligned with the second lateral center of the second singulation trench.

5. The method according to claim 4, wherein the first dies are singulated from the first strips and the second dies are singulated from the second strips via cutting along a common line.

6. The method according to claim 5, wherein the first dies and the second dies are singulated, thereby forming at least one side face with a stepped contour.

7. The method according to claim 5 wherein the first dies and the second dies are singulated, thereby forming two opposing side faces with a stepped contour.

8. The method according to claim 1, further comprising:
    depositing a metallization layer on a rear surface of the first wafer and on the rear surface of the second wafer.

9. The method according to claim 1, further comprising:
    laser marking the at least one package;
    attaching an upper surface of the at least one package to a package lamination tape;
    removing the adhesive tape;
    testing the at least one package;
    removing the package lamination tape; and
    packing the at least one package into a packing tape.

* * * * *